United States Patent
Marui

[11] Patent Number: 5,675,148
[45] Date of Patent: *Oct. 7, 1997

[54] SCANNING REFLECTION ELECTRON DIFFRACTION MICROSCOPE

[75] Inventor: Takao Marui, Kanagawa, Japan

[73] Assignee: Shimadzu Corporation, Kyoto, Japan

[*] Notice: The terminal 48 months of this patent has been disclaimed.

[21] Appl. No.: 827,422

[22] Filed: Jan. 29, 1992

[30] Foreign Application Priority Data

Feb. 15, 1991 [JP] Japan .................................. 3-021763

[51] Int. Cl.⁶ .................................................. H01J 37/26
[52] U.S. Cl. ........................... 250/306; 250/310; 250/314
[58] Field of Search ................................. 250/306, 310, 250/311, 397

[56] References Cited

U.S. PATENT DOCUMENTS 4,211,924  7/1980  Muller et al. ........................ 250/311
5,010,250  4/1991  Elsayed-Ali et al. ................ 250/310
5,093,573  3/1992  Mikoshiba et al. .................. 250/310

FOREIGN PATENT DOCUMENTS 60-230346  11/1985  Japan .

*Primary Examiner*—Bruce C. Anderson
*Attorney, Agent, or Firm*—Heller, Ehrman, White & McAuliffe

[57] ABSTRACT

A scanning reflection electron diffraction microscope causes a primary electron beam from its electron gun to be reflectively diffracted from a sample and a diffraction pattern to be formed on a fluorescent screen. An optical lens reduces this diffraction pattern in size and forms its reduced image on a photoelectric surface, thereby producing an image-carrying electron beam. Deflected by a deflecting system including a deflecting coil and a condenser coil, the image-carrying electron beam is detected by an electron-multiplier such that a diffraction pattern is displayed on a cathode ray tube.

14 Claims, 3 Drawing Sheets

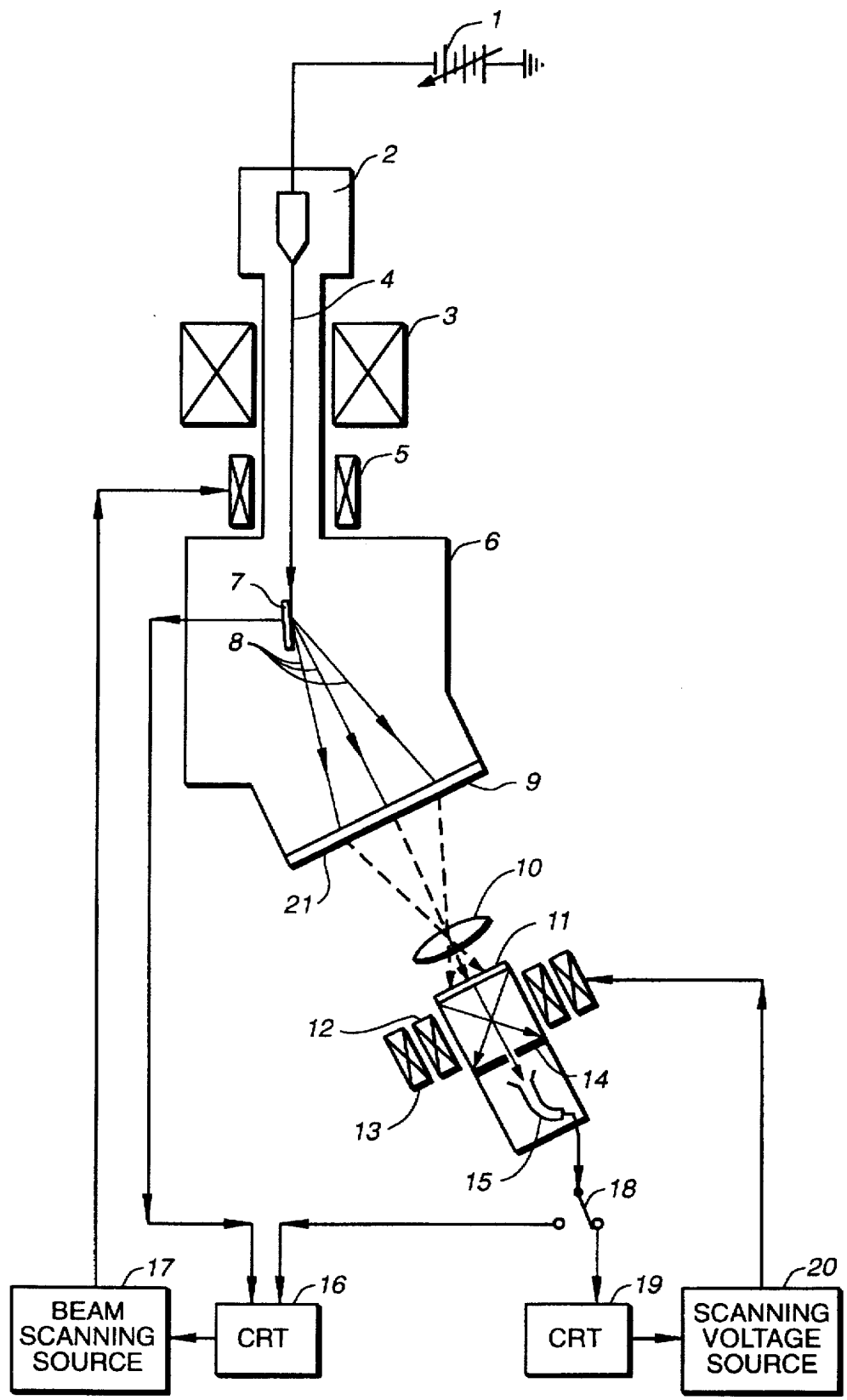
FIG._1

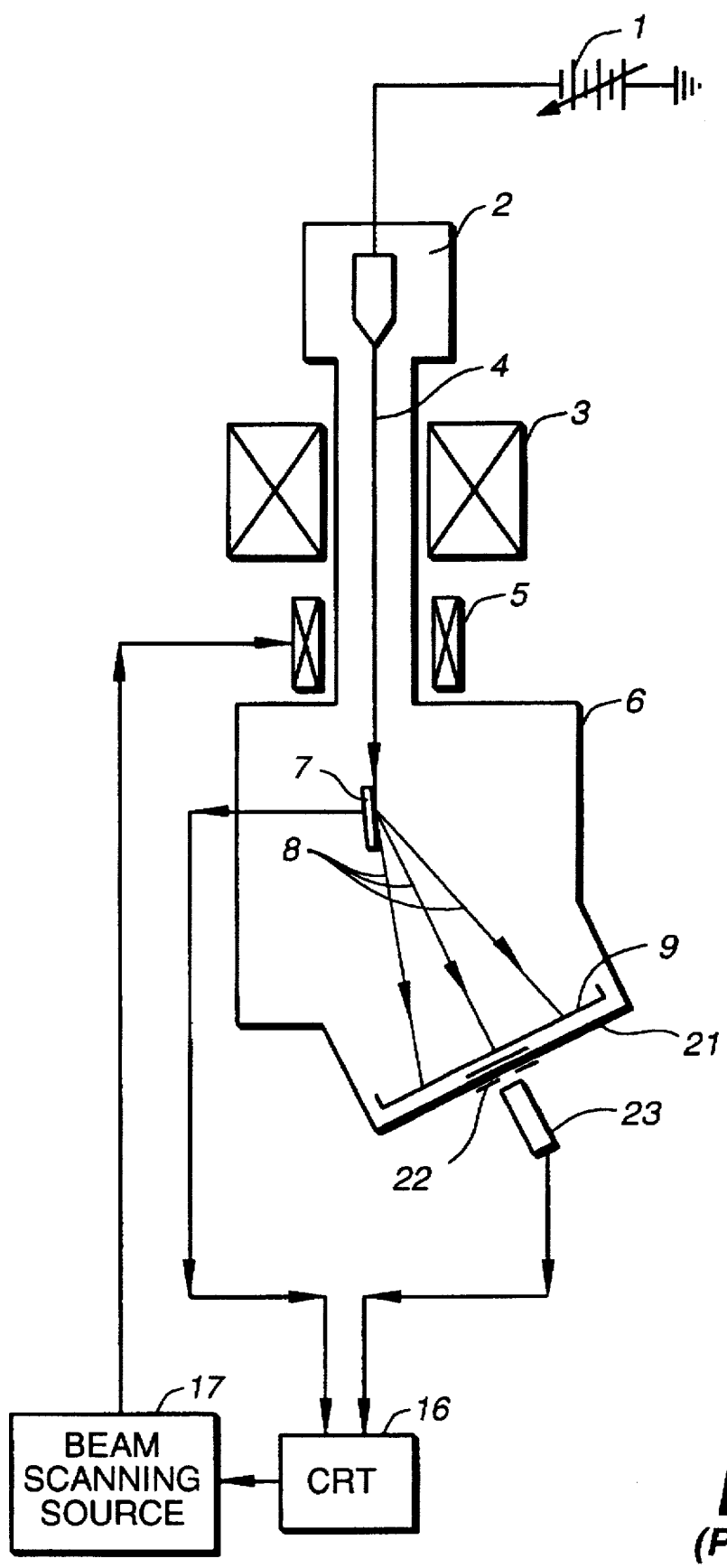
FIG._2
*(PRIOR ART)*

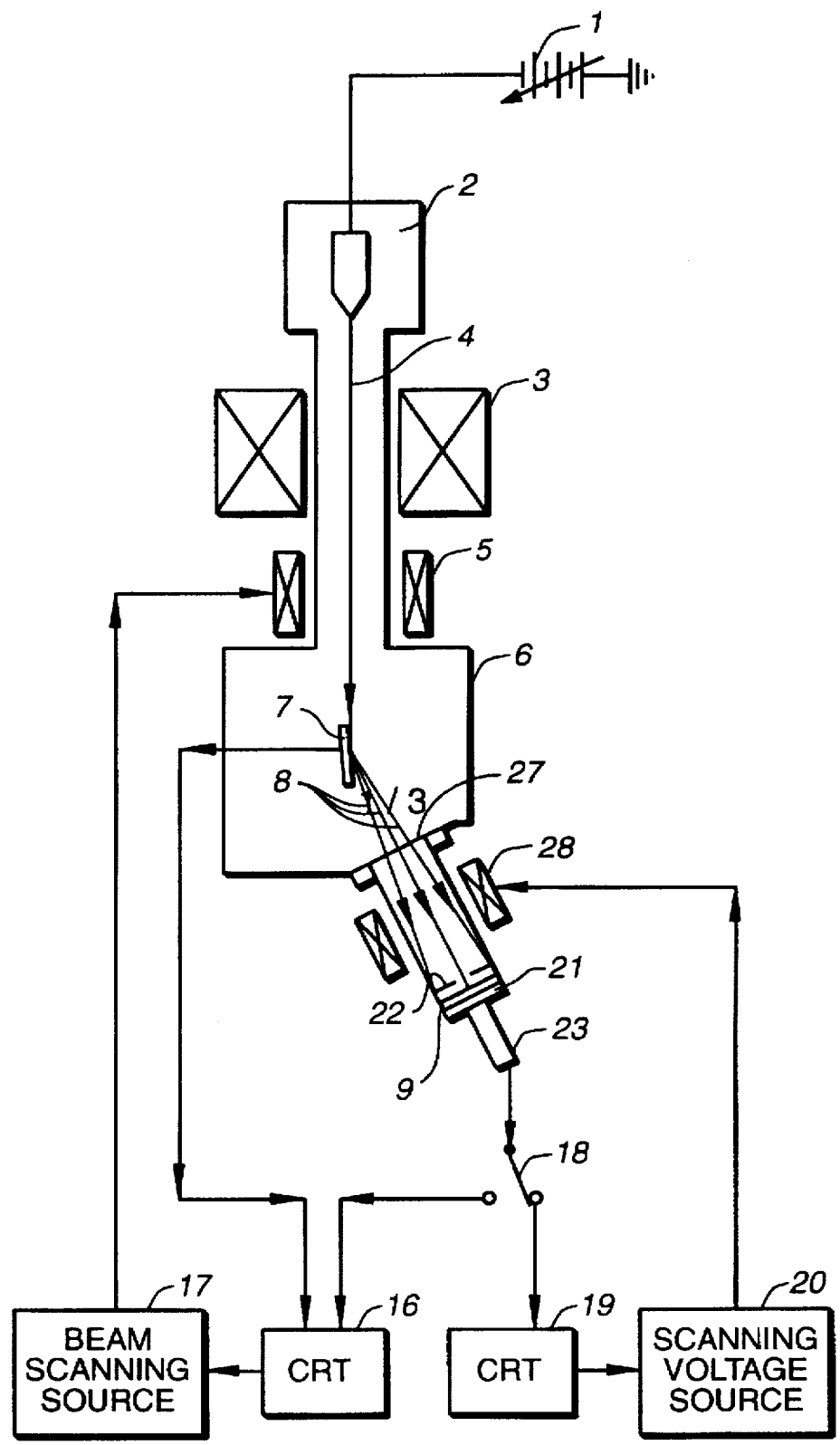
FIG._3
*(PRIOR ART)*

SCANNING REFLECTION ELECTRON DIFFRACTION MICROSCOPE

BACKGROUND OF THE INVENTION

This invention relates to scanning reflection electron diffraction microscopes and, more particularly, to apparatus such as a scanning reflection high-energy electron diffraction (RHEED) microscope and a scanning low-energy electron diffraction (LEED) microscope for observing not only electron diffraction patterns but also changes with time of the intensity of a selected diffraction spot.

As shown in FIG. 2, a prior art scanning RHEED microscope includes an electron gun 2 with a high-voltage source, and a primary electron beam 4 emitted therefrom is caused by a condenser lens 3 to converge on the surface of a sample 7 disposed inside a vacuum chamber 6 and scans the surface as a deflecting coil 5 for the beam 4 is controlled by means of a beam scanning source 17. The sample current signal thus obtained from the sample 7 is transmitted to a cathode ray tube (CRT) 16 as a brightness modulation signal so as to produce a sample current image of the sample 7 on the CRT 16, such that the user can select from this sample current image a point on the sample 7 which is to be analyzed. Next, as the primary electron beam 4 is made incident on this selected point, an image is obtained on a fluorescent screen 9 by reflectively diffracted beam 8, and such an image can be observed as a diffraction pattern through a viewing window 21. By studying such a diffraction pattern, one can analyze the crystalline structure of the sample 7 at any surface position.

If an aperture screen 22 is used to select a particular diffraction spot and an electric signal obtained from a photo-cathode 23 is transmitted as a brightness modulation signal to the CRT 16 in synchronism with the scanning of the primary electron beam 4, an scanning image is obtained on the CRT 16. Such images which are obtained by using the intensities of specific diffraction spots are a powerful tool for the study of crystalline surface structure of a sample.

With a prior art scanning RHEED microscope of this type, the fluorescent screen 9 is required to be rather large if the user wishes to view a relatively wide range of reflectively diffracted beam, and this has the undesirable result of increasing the size of the apparatus as a whole. After a specific diffraction spot is selected, furthermore, the photo-cathode 23 and the aperture screen 22 must be moved mechanically, and this adversely affects the operating efficiency of the apparatus. Still another drawback of an apparatus of this type is that special devices, for example, for storing two-dimensional image data are required for carrying out image processing of a diffraction pattern. Japanese Patent Publication Tokkai 60-56344 disclosed a scanning reflection electron diffraction microscope as shown in FIG. 3 for eliminating these drawbacks. For convenience, components in FIG. 3 which are substantially identical to those shown in FIG. 2 are indicated by the same numerals. The microscope of FIG. 3 may be characterized as having a deflecting coil 28 and a magnetic shield plate 27. A portion of the primary electron beam 4 reflectively diffracted by a sample 7 passes through the magnetic shield plate 27, and an even smaller portion thereof passes though an aperture in a screen 22 to form a bright spot on a fluorescent screen 9. A photo-cathode 23 receives the light signal from this bright spot through a viewing window 21 and converts this light signal into an electrical signal which is used as brightness modulation signal by a CRT 19 for the diffracted beam. At this moment, the deflecting coil 28 is operated by means of a scanning voltage source 20 so as to deflect the diffracted beam 8 which has passed the magnetic shield plate 27 and to thereby form on the CRT 19 a brightness modulation pattern in synchronism with this deflection. The magnetic shield plate 27 plays the role of screening the magnetic field which is generated when the deflecting coil 28 for the diffracted beam 8 is activated such that the point of incidence by the primary electron beam 4 can be maintained unchanged. The brightness modulation pattern thus obtained on the CRT 19 is completely equivalent to the diffraction pattern obtained on the fluorescent screen 9 on the apparatus of FIG. 2.

The microscope of FIG. 3 is further provided with a signal switch 18 and a second CRT 16 for displaying scanning images observed by using the intensities of specific diffraction spots. When such an image is desired from a specific diffraction spot, the scanning circuit for the first CRT 19 for the diffracted beam 8 is adjusted such that the cathode ray beam of the CRT 19 will be fixed at the position of the desired diffraction spot in the diffraction pattern which is being displayed on the CRT 19. If the signal switch 18 is thereafter switched to the second CRT 16 and the electron beam 4 is caused by means of a beam scanning source 17 to scan the surface of the sample 7, a desired scanning image according to the intensity of diffracted electron beam can be obtained on the second CRT 16.

The scanning reflection electron diffraction microscope of FIG. 3 is advantageous in that it does not require a fluorescent screen of a large diameter for forming diffraction patterns and it has improved operability because all signals are obtained electrically. Another advantage of this microscope is that the electrical signals from the photo-cathode 23 obtained in synchronism with the scanning by the scanning voltage source 20 can be stored in a memory device.

This allows the user to easily carry out various image processing, for example, to increase the signal-to-noise ratio. In other words, the microscope of FIG. 3 is capable of eliminating the drawbacks of the older microscope of FIG. 2, which not only requires its photo-cathode 23 and aperture screen 22 to be moved mechanically for selecting a specific diffraction spot but also other dedicated devices, say, for storing two-dimensional images, to carry out image processing of a diffraction pattern.

With all such advantages, however, the microscope of FIG. 3 is not capable of detecting diffracted electrons with large angles of diffraction because the range of detectable angle of diffraction is limited by the distance between the sample 7 and the scanning coil assembly and the intensity of the magnetic field generated by the deflecting coil for the diffracted beam. In order to be able to detect diffracted electrons with large angles of diffraction, it is necessary either to provide a large scanning coil or to place the scanning coil assembly near the sample. If a large scanning coil is used, the microscope as a whole becomes large. On the other hand, the scanning coil assembly cannot be kept near the sample all the time because samples are frequently replaced. This means that mechanisms for moving the scanning coil assembly and adjusting its position will be required and hence that the structure of the apparatus becomes complicated.

SUMMARY OF THE INVENTION

The present invention has been accomplished with the object of eliminating the disadvantages of the prior art apparatus as described above with reference to FIGS. 2 and 3.

It is therefore an object of the present invention to provide a scanning reflection electron diffraction microscope with improved scanning capability which is capable of detecting even diffracted electrons with large angles of diffraction without using a large scanning coil and without keeping the detector close to the sample.

A scanning reflection electron diffraction microscope according to the present invention, with which the above and other objects can be achieved, may be characterized as having its diffraction pattern detection means comprised of an optical reduction system for optically reducing the size of a diffraction pattern on a fluorescent screen, a photoelectric surface for converting an optically reduced diffraction pattern into an image-carrying electron beam, a deflecting system for deflecting electrons emitted from the photoelectric surface, an aperture screen for passing therethrough electrons deflected by the deflecting system, and a detector for detecting electrons which have passed through the aperture.

With a microscope thus structured, a diffraction pattern on the fluorescent screen is reduced in size by the optical reduction system to form a reduced image on the photoelectric surface, and the electrons emitted from this photoelectric surface is deflected by the deflecting system. The output from the detector, which detects the electrons passing through the aperture, is added as a brightness modulation signal to a CRT in synchronism with the deflection by the deflecting system, and a brightness modulation pattern is displayed on the CRT for diffracted beam. The brightness modulation pattern thus obtained is completely equivalent to the diffraction pattern formed on the fluorescent screen. A scanning image obtained by using the intensity of a specific diffraction spot can be displayed on a CRT by setting the deflecting system at the position of the selected diffraction spot and scanning the electron beam over the surface of the sample.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a schematic which shows the structure of a scanning reflection electron diffraction microscope embodying the present invention;

FIG. 2 is a schematic which shows the structure of a prior art scanning reflection electron diffraction microscope; and FIG. 3 is a schematic which shows the structure of another prior art scanning reflection electron diffraction microscope.

DETAILED DESCRIPTION OF THE INVENTION

A scanning reflection electron diffraction microscope embodying the present invention is described next with reference to FIG. 1, wherein numerals 1-8 and 16-21 indicate components indicated correspondingly by the same numerals in FIG. 3, numeral 9 indicates a fluorescent screen, numeral 10 indicates an optical lens, numeral 11 indicates a photoelectric surface, numeral 12 indicates an deflecting coil, numeral 13 indicates a condenser coil, numeral 14 indicates an aperture screen and numeral 15 indicates a photo-multiplier. A method of using this microscope to obtain a reflection electron diffraction pattern is explained next.

As explained above in connection with the prior art microscopes shown in FIGS. 2 and 3, the electron gun 2 provided with a high voltage source 1 emits a primary electron bean 4, and the condenser lens 3 causes this primary electron beam 4 to converge on the surface of a sample 7 disposed inside the vacuum chamber 6. As the deflecting coil 5 is controlled by the beam scanning source 17, the primary electron beam 4 scans the surface of the sample 7 and produces a sample current signal, and a sample current image of the sample 7 is obtained on the CRT 16 by transmitting this sample current signal to the CRT 16 as a brightness modulation signal. If the user selects from this current image a target position which requires an analysis and makes the primary electron beam 4 fixedly incident on this selected position, the reflectively diffracted beam 8 forms a diffraction pattern on the fluorescent screen 9. The diffraction pattern, thus formed on the fluorescent screen 9, is optically reduced in size and focussed on the photoelectric surface 11 by means of the optical lens 10 so as to be converted into an electronic image. The electrons which pass through the aperture in the screen 14 are detected by the electron-multiplier 15 and the detected results are transmitted as brightness modulation signal through the switch 18 to the CRT 19 for diffracted beam. During this process, the scanning voltage source 20 is operated by a scanning signal from the CRT 19 such that the electrons from the photoelectric surface 11 are deflected by the electron deflecting system comprised of the deflecting coil 12 and the condenser coil 13 to thereby display a brightness modulation image on the CRT 19. The brightness modulation image thus obtained on the CRT 19 is completely equivalent to the diffraction pattern on the fluorescent screen 9.

In order to obtain a scanning image by using the intensity of a specific diffraction spot, the scanning signal from the CRT 19 is adjusted so as to fix the cathode ray of the CRT 19 at the position of the selected diffraction spot in the diffraction pattern which is being displayed on the CRT 19. After it is so adjusted that only the electrons emitted from the position on the photoelectric surface corresponding to the selected diffraction spot on the fluorescent screen 9 are being detected through the aperture in the screen 14 by the electron-multiplier 15, the signal switch 18 is switched to the other CRT 16 and the primary electron beam 4 is caused to scan the surface of the sample 7 by controlling the beam scanning source 17 and to thereby produce a scanning image on the CRT 16.

The present invention has been described above with reference to only one example, but this example is by no means intended to be interpreted as limiting the scope of the invention. Instead, it is to be understood that many modifications and variations are possible within the scope of this invention. For example, although it was stated that an optical lens is used in the optical reduction system, use may be made equally well of an optical fiber plate. The use of an optical fiber plate has the advantage of carrying out vacuum sealing and optical reduction of image at the same time as well as that of reducing the transmission loss of optical signals. As another example, it is not necessary that the beam scanning source be operated by a scanning signal from the CRT. The sweeping of the CRT may be controlled by an output from the beam scanning source. Moreover, use may be made of a single CRT such that a diffraction pattern and a scanning image can be selectively displayed thereon. This may be accomplished by selectively supplying the output from the scanning voltage source 20 or that from the beam scanning source 17 to the CRT as sweep signal.

In summary, since a scanning reflection electron diffraction microscope according to the present invention uses an optical reduction system to optically transform a diffraction image on a fluorescent screen into a reduced image on a photoelectric screen and deflects the resultant image-carrying electrons by means of a deflecting system, it is possible to detect even electrons with large diffraction angles without using a large scanning coil and without unreasonably reducing the distance between the sample and the detector.

What is claimed is:

1. A scanning reflection electron diffraction microscope comprising:

electron beam source means for producing a primary electron beam;

a fluorescent screen;

pattern forming means for directing said primary electron beam to a target to thereby form a diffraction pattern on said fluorescent screen with reflectively diffracted beam from said target;

photoelectric converter means for converting an optical image into an image-carrying electron beam;

image reducing means for producing a reduced image on said photoelectric converter means by optically reducing a diffraction pattern formed on said fluorescent screen;

a deflecting system for deflecting an electron beam emitted from said photoelectric converter means;

an aperture screen having an aperture; and a detector for detecting electrons which have been deflected by said deflecting system and have passed through said aperture.

2. The scanning reflection electron diffraction microscope of claim 1 further comprising a cathode ray tube, wherein said detector serves to produce and transmit to said cathode ray tube a brightness modulation signal so as to cause a diffraction pattern displayed on said cathode ray tube.

3. The scanning reflection electron diffraction microscope of claim 1 further comprising:

a cathode ray tube; and deflection control means for controlling said deflecting system by receiving a scanning signal from said cathode ray tube so as to cause said detector means to transmit a brightness modulation signal to said cathode ray tube and to thereby have a brightness modulation image displayed on said cathode ray tube.

4. The scanning reflection electron diffraction microscope of claim 1 wherein said photoelectric converter means includes a photoelectric conversion surface, and said image reducing means is to focus on said photoelectric conversion surface said reduced image of a diffraction pattern formed on said fluorescent screen.

5. The scanning reflection electron diffraction microscope of claim 4 wherein said image reducing means comprises a lens which is disposed between said fluorescent screen and said photoelectric conversion surface.

6. The scanning reflection electron diffraction microscope of claim 1 wherein said image reducing means comprises a lens which is disposed between said fluorescent screen and said photoelectric converter means.

7. The scanning reflection electron diffraction microscope of claim 1 wherein said deflecting system includes coils which deflect electrons of said image-carrying electron beam traveling from said photoelectric converter means to said aperture screen.

8. In a scanning reflection electron diffraction microscope which causes a primary electron beam from an electron beam source to be incident on a specified surface area of a sample at a specified angle of incidence, thereby forming a diffraction pattern on a fluorescent screen by reflectively diffracted beam from said specified surface area, and obtaining a scanning image by selectively using the intensities of light emitted from only a specified diffraction spot in said diffraction pattern on said fluorescent screen, the improvement wherein said microscope comprises:

image reducing means for producing a reduced image by optically reducing a diffraction pattern formed on said fluorescent screen;

a photoelectric conversion surface for converting an optically reduced diffraction pattern into an electronic image;

a deflecting system for deflecting electrons from said photoelectric conversion surface;

an aperture screen having an aperture for allowing electrons from said photoelectric conversion surface to pass therethrough; and a detector for detecting electrons which have passed through said aperture.

9. The scanning reflection electron diffraction microscope of claim 8 further comprising a cathode ray tube, wherein said detector serves to produce and transmit to said cathode ray tube a brightness modulation signal so as to cause a diffraction pattern displayed on said cathode ray tube.

10. The scanning reflection electron diffraction microscope of claim 8 further comprising:

a cathode ray tube; and deflection control means for controlling said deflecting system by receiving a scanning signal from said cathode ray tube so as to cause said detector means to transmit a brightness modulation signal to said cathode ray tube and to thereby have a brightness modulation image displayed on said cathode ray tube.

11. The scanning reflection electron diffraction microscope of claim 8 wherein said image reducing means is to focus on said photoelectric conversion surface said reduced image of a diffraction pattern formed on said fluorescent screen.

12. The scanning reflection electron diffraction microscope of claim 11 wherein said image reducing means comprises a lens which is disposed between said fluorescent screen and said photoelectric conversion surface.

13. The scanning reflection electron diffraction microscope of claim 8 wherein said image reducing means comprises a lens which is disposed between said fluorescent screen and said photoelectric conversion surface.

14. The scanning reflection electron diffraction microscope of claim 8 wherein said deflecting system includes coils which deflect electrons traveling from said photoelectric conversion surface to said aperture screen.

* * * * *